United States Patent [19]
Shiobara et al.

[11] Patent Number: 4,985,751
[45] Date of Patent: Jan. 15, 1991

[54] RESIN-ENCAPSULATED SEMICONDUCTOR DEVICES

[75] Inventors: Toshio Shiobara, Annaka; Takashi Tsuchiya, Takasaki; Hisashi Shimizu, Annaka, all of Japan

[73] Assignee: Shin-Etsu Chemical Co., Ltd., Tokyo, Japan

[21] Appl. No.: 404,600

[22] Filed: Sep. 8, 1989

[30] Foreign Application Priority Data

Sep. 13, 1988 [JP] Japan ................................ 63-229368

[51] Int. Cl.$^5$ .......................................... H01L 23/28
[52] U.S. Cl. ........................................ 357/72; 357/80
[58] Field of Search ............................. 357/71, 72, 80

[56] References Cited
U.S. PATENT DOCUMENTS 4,529,755 7/1985 Nishikawa et al. ................. 523/436

FOREIGN PATENT DOCUMENTS

| 023444749 | 4/1986 | German Democratic Rep. ... 357/72 |
| 57-152157 | 9/1982 | Japan ........................................ 357/72 |
| 58-82545 | 5/1983 | Japan ........................................ 357/72 |
| 0181037 | 10/1984 | Japan ........................................ 357/72 |
| 60-30157 | 2/1985 | Japan ........................................ 357/72 |
| 63-207158 | 8/1988 | Japan ........................................ 357/72 |

Primary Examiner—Andrew J. James
Assistant Examiner—Donald L. Morin, Jr.
Attorney, Agent, or Firm—Birch, Stewart, Kolasch & Birch

[57] ABSTRACT

A resin-encapsulated semiconductor device is of the structure wherein a silicon chip on a die pad is encapsulated with a molding resin. The rear surface of the die pad remote from the silicon chip, preferably the entire surfaces of the elements are treated with a primer, typically a silane coupling agent and a low stress epoxy resin encapsulant is used, preventing the encapsulating resin from separating and cracking upon subsequent dipping in solder bath.

12 Claims, 1 Drawing Sheet

RESIN-ENCAPSULATED SEMICONDUCTOR DEVICES

This invention relates to resin-encapsulated semiconductor devices which are readily mounted on printed circuit boards.

BACKGROUND OF THE INVENTION

The current mainstream in the semiconductor industry is the manufacture of semiconductor devices in resin-encapsulated form including diodes, transistors, IC's, LSI's, and super LSI's. A steadily increasing demand is expected for them. As semiconductor devices progressively increase their degree of integration, the chip size is also increased. Nevertheless packages are desired to have as small dimensions as possible. Semiconductor devices are now commercially available in thin compact packages irrespective of larger chips.

Such thin compact packages of semiconductor devices with larger chips are then assembled on printed circuit boards. One common practice is to dip the packages in a solder bath or pass the packages through a hot zone where solder melts, ensuring the automated connection of the semiconductor devices to the printed circuit boards. However, when thin compact packages of semiconductor devices with larger chips are dipped in solder bath or exposed to a solder-melting hot zone, the resulting thermal shock would often cause the encapsulating resin to crack, losing the reliability of semiconductor devices. Occurrence of cracks in the encapsulating resin becomes frequent when the resin contains moisture. Since it is unavoidable in the actual manufacturing process that the encapsulating resin absorbs moisture, the crack occurrence creates a serious problem in the actual assembly operation.

SUMMARY OF THE INVENTION

Therefore, an object of the present invention is to provide a resin-encapsulated semiconductor device which can be manufactured in a thin compact package with a relatively large size of semiconductor chip while eliminating the above-mentioned problems.

Another object of the present invention is to provide a resin-encapsulated semiconductor device which can be dipped in a solder bath or exposed to a hot zone where solder melts without cracks in the encapsulating resin.

Briefly stated, the present invention provides a resin-encapsulated semiconductor device comprising a silicon chip on a die pad wherein an encapsulating resin is molded over these elements. According to the present invention, at least the rear surface of the die pad remote from the silicon chip is treated with a primer. Preferably at least part of the surfaces, most preferably the entire surfaces of the elements which are to be encapsulated with the resin are treated with the primer. The encapsulating resin comprises a low stress epoxy resin encapsulant having a tensile elongation of at least 0.7% at room temperature (25° C.) and a moisture pickup of up to 0.6% by weight after a disk sample of 50 mm in diameter and 3 mm in thickness is allowed to stand for 72 hours in an atmosphere at 85° C. and a relative humidity (RH) of 85%. Even when the semiconductor device is manufactured to a thin compact package with a relatively large size of semiconductor chip, the device can be dipped in a solder bath or exposed to a solder-melting hot zone without the risk of causing cracks in the encapsulating resin. The device thus ensures reliable and efficient assembly operation.

More precisely, the present invention provides a resin-encapsulated semiconductor device comprising a die pad, a silicon chip on the die pad, and a lead frame electrically connected to the silicon chip. An encapsulating resin is molded over these elements. When this device is dipped in a solder bath or exposed to a solder-hot zone, it is the rear surface of the die pad remote from the silicon chip that the encapsulating resin is most likely to separate away. Thus, at least the rear surface of the die pad is treated with a primer. Preferably at least part of the surfaces, most preferably the entire surfaces of the elements which are to be encapsulated with the resin are primed for enhancing the bond between the elements and the encapsulating resin. The encapsulating resin comprises a low stress epoxy resin encapsulant. The low stress means that the epoxy resin encapsulant has a tensile elongation of at least 0.7% at room temperature (25° C.) and a moisture pickup of up to 0.6% by weight after a disk sample of 50 mm in diameter and 3 mm in thickness is allowed to stand for 72 hours in an atmosphere at 85° C. and RH 85%. When the device is dipped in a solder bath or passed through a solder-melting hot zone, the elongation of the encapsulating resin accommodates the shearing forces occurring at the interface between the encapsulating resin and the elements therein, particularly lead frames, due to the difference in coefficient of expansion therebetween. The minimized moisture absorption of the encapsulating resin substantially prevents generation of a noticeable quantity of water vapor upon solder bath or hot zone passage which is one of causes for crack occurrence. As a consequence, the crack occurrence in the encapsulating resin upon solder bath dipping or hot zone passage is minimized.

BRIEF DESCRIPTION OF THE DRAWINGS

The above and other objects, features, and advantages of the present invention will be better understood from the following description taken in conjunction with the accompanying drawings, in which.

DETAILED DESCRIPTION OF THE INVENTION

The present invention provides a resin-encapsulated semiconductor device comprising a die pad, a silicon chip on the die pad, a lead frame electrically connected to the silicon chip, and an encapsulating resin molded over the elements wherein at least the rear surface of the die pad remote from the silicon chip is treated with a primer, and the encapsulating resin comprises a specific epoxy encapsulant.

The semiconductor device includes a silicon chip, a die pad on which the silicon chip rests, and lead frames electrically connected to the silicon chip. These device constituting elements are encapsulated with a resin.

Figure 1:
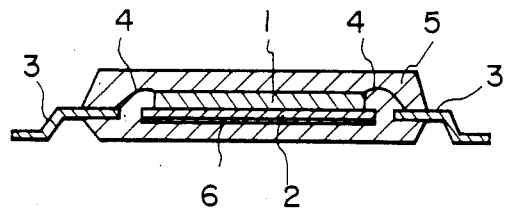
FIGS. 1 to 3 are schematic cross sections of resin-encapsulated semiconductor devices according to different embodiments of the present invention, respectively.

Referring to FIG. 1, there is illustrated a resin-encapsulated semiconductor device according to one embodiment of the invention. The device includes a silicon chip 1 and a die pad 2. The die pad 2 has a pair of opposed major surfaces, front and rear surfaces. The silicon chip 1 rests on the front surface of the pad 2. A pair of lead frames 3 and 3 are disposed adjacent the chip 1 on opposite sides thereof. The silicon chip 1 is connected to the lead frames 3 and 3 through bonding wires 4 and 4. A resin 5 is molded over these elements.

Figure 2:
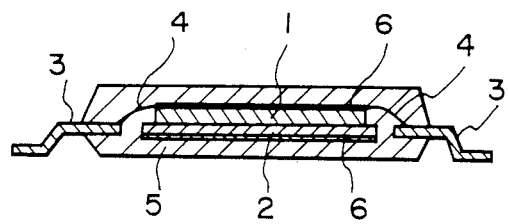
Figure 3:
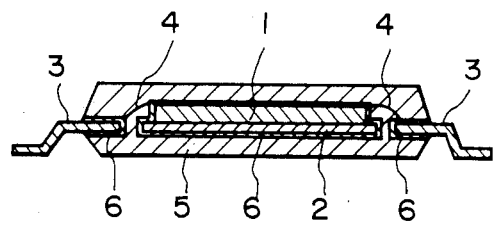

According to the present invention, at least the rear surface of the die pad 2 remote from the silicon chip 1 is primed. Priming is depicted as a primer coating 6 solely on the rear surface of pad 2 in FIG. 1. Preferably, selected surfaces, most preferably entire surfaces, of the silicon chip 1, die pad 2 and lead frames 3 which are to be encapsulated with resin are primed. Preferred embodiments of priming are shown in FIGS. 2 and 3. In FIG. 2, primer coatings 6 are on the rear surface of pad 2 and the top surface of silicon chip 1. In FIG. 3, primer coatings 6 are on the entire surfaces of the elements, silicon chip 1, die pad 2, and lead frames 3 which are to be in contact with the encapsulating resin 5.

The primer used herein is not particularly limited. Preferred are primers predominantly comprising silane coupling agents, especially silane coupling agents having at least one nitrogen atom or epoxy group per molecule, most often diluted with suitable solvents. Any desired well-known silane coupling agents may be used as long as they have a functional group capable of reacting with the encapsulating resin.

Preferably, the silane coupling agents have the general formula:

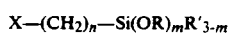

X—(CH$_2$)$_n$—Si(OR)$_m$R'$_{3-m}$ wherein X is an organic radical having up to 15 carbon atoms and having at least one member selected from the group consisting of epoxy, amino, carboxyl, hydroxyl, ureido, maleimide, and trialkoxysilyl radicals, R is a monovalent hydrocarbon radical having 1 to 6 carbon atoms, such as alkyl, alkenyl, and aryl radicals, R' is a monovalent hydrocarbon radical having 1 to 6 carbon atoms, such as alkyl, alkenyl, and aryl radicals, n is an integer of from 1 to 10, and m is an integer of from 1 to 3.

Also included are partial hydrolyzates of the compounds of the above general formula. Preferred examples of the silane coupling agent are shown below.

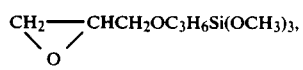

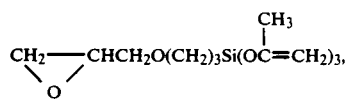

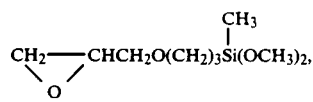

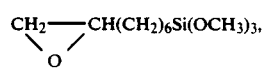

NH$_2$C$_3$H$_6$Si(OCH$_3$)$_3$,
NH$_2$C$_2$H$_4$NHC$_3$H$_6$Si(OCH$_3$)$_3$,
HSC$_3$H$_6$Si(OCH$_3$)$_3$,

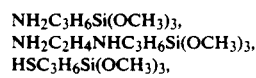

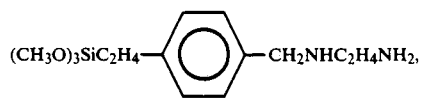

(CH$_3$O)SiC$_3$H$_6$NHC$_2$H$_4$NHCH$_2$CH=CH$_2$,

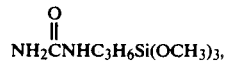

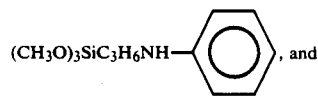

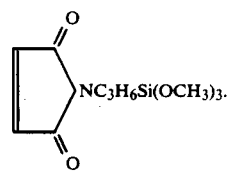

They may be used alone or in admixture of two or more. They may also be used in partially hydrolyzed state.

When not only the die pad rear surface, but also the silicon chip surface are treated with a primer predominantly comprising such a silane coupling agent, it is preferred to control the halogen content of the silane coupling agent to at most 50 ppm, especially at most 10 ppm. If the silicon chip surface is coated with a primer predominantly comprising a silane coupling agent having a halogen content of more than 50 ppm, then the chip's electrodes are susceptible to corrosion by the halogen. In order to enhance the reactive bond of the primer to the encapsulating resin, bond-improving agents may be added to the primer. The bond-improving agents include organotitanates such as titanium tetrabutoxide, titanium tetraisopropoxide, titanium tetra-n-butoxide, and nitrogen compounds such as primary, secondary and tertiary amines, and cycloamidine derivatives. Such bond-improving agents may be added in amounts of 0.001 100 parts by weight, preferably 0.1 to 80 parts by weight to 100 parts by weight of the silane coupling agents.

Since it is difficult to control the amount of the primer coated, it is rather desirable to evenly apply a solution of the primer in a controlled concentration as by spraying, brush coating, dipping or the like. The silane coupling agents and bond-improving agents if any are generally diluted with a solvent to a concentration of 10% by weight or lower for ease of application as the primer. The concentration of the primer in the coating solution has no particular lower limit because a desired coating thickness can be reached by repeating the coating operation as by brush coating. However, such repetitive coating is less efficient and the primer concentration is desirably 0.5% by weight or higher. The coating of primer generally has a thickness of up to 10 μm, preferably up to 5 μm. The solvent is chosen by taking into account its wettability to the elements (including the silicon chip, die pad, and lead frames) and volatility. It is often preferred to use rubber solvent, isopropyl alcohol, tetrahydrofuran, and toluene. Hexane, cyclohexane, n-heptane, methyl ethyl ketone, ethyl acetate and other analogous solvents are also useful for the primer solution.

After treated with the primer as described above, the semiconductor device of the invention is encapsulated with a low stress epoxy resin. The epoxy resin encapsulant should have a tensile elongation of at least 0.7% at room temperature (25° C.) and a moisture pickup of up to 0.6% by weight, preferably up to 0.5% by weight, after a disk sample of 50 mm in diameter and 3 mm in thickness is allowed to stand for 72 hours in an atmosphere at 85° C. and RH 85%. An epoxy resin encapsulant having a tensile elongation of less than 0.7% at room temperature would separate from the embedded elements upon dipping in a solder bath or passage through a hot zone because shearing forces occur at the interface between the encapsulating resin and the elements, particularly lead frames, due to the difference in coefficient of expansion therebetween. If the epoxy resin encapsulant has a moisture pickup of more than 0.6% by weight, exposure to elevated temperatures causes the moisture in the resin to evaporate into water vapor, incurring cracks in the resin. It should be noted that the moisture pickup of epoxy resin increases as its glass transition temperature increases. In order to control the resin moisture pickup to 0.6% by weight or lower, the resin should have a glass transition temperature of 200° C. or lower.

The epoxy resin encapsulant used herein is most often a composition comprising (A) an epoxy resin, (B) a phenol resin of the novolak type as a curing agent, (C) a tensile elongation modifier, (D) an inorganic filler, and (E) a curing promoter.

The epoxy resin (A) used herein may include a variety of commonly used epoxy resins. The epoxy resin is not particularly limited with respect to molecular structure and molecular weight as long as it has at least two epoxy groups in its molecule. Useful examples are aromatic resins of the bisphenol type, cycloaliphatic resins such as cyclohexane derivatives, and epoxy novolak resins of the general formula:

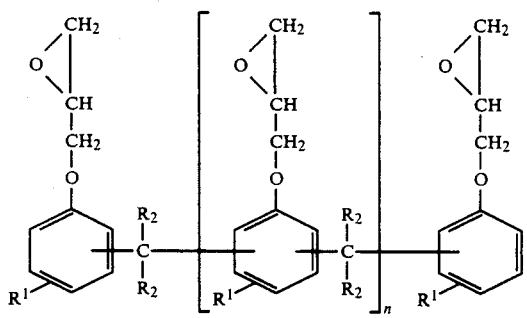

wherein $R^1$ is a hydrogen atom, halogen atom, or alkyl radical having 1 to 6 carbon atoms, $R^2$ is a hydrogen atom or alkyl radical having 1 to 6 carbon atoms, n is an integer of at least 1. Epoxidized derivatives of triphenolmethane and their polymers are also useful. These epoxy resins may be used alone or in admixture of two or more.

The novolak type phenol resins (B) used herein are phenol resins of the novolak type obtained by reacting phenols such as phenol and alkyl phenols with formaldehyde or para-formaldehyde, and modified resins thereof, for example, epoxidized or butylated novolak type phenol resins. The novolak type phenol resin is preferably blended in such a proportion that the ratio (a/b) of the moles (a) of epoxy radical of the epoxy resin (A) to the moles (b) of phenolic hydroxyl radical of the novolak type phenol resin (B) is in the range of from 1/10 to 10/1. Molar ratios (a/b) of less than 1/10 or more than 10/1 are undesirable because moisture resistance, moldability, and cured products' electrical properties become poor.

To improve the tensile elongation of cured epoxy resin products, (C) high molecular weight thermoplastic elastomers, silicone rubber powder, or aromatic polymer-silicone block copolymers may be added to the epoxy resin composition. Examples of the thermoplastic elastomer include styrene-butadiene-methyl methacrylate (MBS) copolymers, styrene-ethylene-butene-styrene (SEBS) copolymers, and organosiloxane-ethylene-propylene (SEP) copolymers. The aromatic polymer-silicone block copolymers are reaction products resulting from addition reaction of an alkenyl radical-containing epoxy or phenol resin with an organopolysiloxane of the general formula:

$$H_a R_b SiO_{\{4-(a+b)\}/2}$$

wherein H is hydrogen, R is a substituted or unsubstituted monovalent hydrocarbon radical, a is from 0.001 to 0.1, b is from 1.9 to 2.0, $1.9 < a+b < 2.2$, the number of silicon atoms per molecular is an integer of from 20 to 1,000, and the number of hydrogen atoms directly attached to the silicon atoms per molecule is an integer of from 1 to 5. The substituted or unsubstituted monovalent hydrocarbon radicals represented by R preferably have 1 to 10 carbon atoms and include an alkyl group having 1 to 10 carbon atoms such as methyl, ethyl, propyl, and butyl groups, an aryl group having 6 to 10 carbon atoms such as phenyl and tolyl groups, an alkoxy group having 1 to 5 carbon atoms such as methoxy and ethoxy groups, and substituted alkyl and aryl groups in which one or more hydrogen atoms are substituted with a halogen atom or trialkoxysilyl group, such as $ClCH_2$—, $CF_3C_2H_4$—, $ClC_3H_6$—,

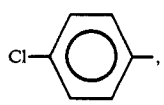

—$C_2H_4Si(OCH_3)_3$, —$C_3H_6Si(OCH_3)_3$, and —$C_2H_4Si(OC_2H_5)_3$. The introduction rate of the alkoxy group may range from 0 to 10 mol % in the R of the formula.

The alkenyl radical-containing epoxy or phenol resin which is reacted with the organopolysiloxane includes a variety of epoxy or phenol resins containing at least two alkenyl radicals per molecule. Examples of the alkenyl radical-containing epoxy resin are given below.

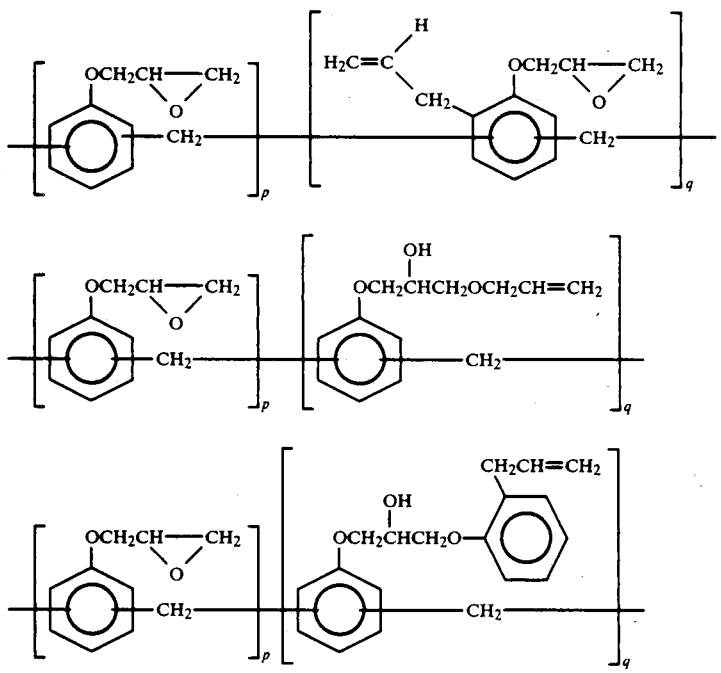

In the above formulae, p and q are generally integers, $1<p<20$, and $1\leq q\leq 10$. These alkenyl radical-containing epoxy resins may be readily prepared by conventional synthesis processes, for example, by epoxidizing an alkenyl radical-containing phenol resin with epichlorohydrin or by partially reacting 2-allylphenol or the like with various well-known epoxy resins.

Component (C) defined above may preferably be blended in an amount of 0 to 100 parts by weight, more preferably 1 to 100 parts by weight per 100 parts by weight of epoxy resin (A).

The epoxy resin composition may further contain an inorganic filler (D). The filler may be selected from silica powder, alumina, antimony trioxide, talc, calcium carbonate, titanium white, clay, asbestos, mica, red oxide, glass fibers, and carbon fibers, with the silica powder and alumina being preferred. The inorganic filler may be blended in an amount of 25 to 90% by weight of the resin composition. Less than 25% by weight of the filler will be less effective in improving moisture resistance, heat resistance, mechanical properties, and moldability whereas more than 90% by weight of the filler is impractical because the composition becomes bulky and low moldable.

In the epoxy resin composition used herein, a curing promoter (E) may preferably be used for the purpose of promoting reaction between the epoxy resin and the curing agent in the form of phenol resin. The curing promoter may be selected from the promoters commonly used for curing of epoxy compounds. Examples include imidazoles such as imidazole, 2-methylimidazole, 2-ethylimidazole, 2,4-dimethylimidazole, 2-ethyl-4-methylimidazole, 2-undecylimidazole, 2-heptadecylimidazole, 1-vinyl-2-methylimidazole, 2-phenyl-4,5-dihydroxymethylimidazole, 2-phenylimidazole, and 2-phenyl-4-methylimidazole; amines such as triethylamine, diethylenetriamine, triethylenetetramine, diethylaminopropylamine, N-aminoethylpiperazine, bis(4-amino-3-methylcyclohexyl)methane, meta-xylyleneamine, menthanediamine, 3,9-bis(3-aminopropyl)-2,4,8,10-tetraoxaspiro(5,5)undecane, and 1,8-diazabicyclo(5,4,0)undecene-7; complex compounds of triethylamine and $BF_3$, organophosphines such as triphenylphosphine, and adducts of amine compounds with acid anhydrides such as trimellitic anhydride. The curing promoter may be used in an effective amount as is commonly known in the art. Preferably, the curing promoter is blended in an amount of 0 to 5 parts by weight, more preferably 0.1 to 5 parts by weight per 100 parts by weight of the total of components (A) and (B). The curing promoter may be used alone or in admixture of two or more depending on the curing promoting ability that the promoters possess.

The resin-encapsulated semiconductor device of the invention is generally manufactured to a thin compact package with a relatively large size of semiconductor chip. The device has eliminated the problem of cracking in the encapsulating resin when subjected to elevated temperatures as by dipping in a solder bath or passing through a solder-melting hot zone. The device is advantageous particularly when manufactured as quad flat packages (QFP) and small outline packages (SOP) in which the die pad has a surface area of at least 25 mm$^2$ and the encapsulating resin is up to 1.5 mm thick under the die pad.

As described above, the resin-encapsulated semiconductor device of the present invention can be dipped in a solder bath or exposed to a solder-melting hot zone without the risk of causing cracks in the encapsulating resin even when the device is manufactured to a thin compact package with a relatively large size of semiconductor chip. The device can thus be efficiently assembled on printed circuit boards in a reliable manner.

EXAMPLE

Examples of the present invention are given below together with comparative examples by way of illustration and not by way of limitation. All parts and percents are by weight unless otherwise stated.

EXAMPLES 1-12

Primers I through VII were prepared by blending the silane coupling agent, bond-improving agent, and solvent shown in Table 1.

TABLE 1

| | Primers | | | | | | |
|---|---|---|---|---|---|---|---|
| | I | II | III | IV | V | VI | VII |
| Silane coupling agent | | | | | | | |
| Type | A | B | C | D | E | F | G |
| Amount (pbw) | 2 | 2.5 | 2 | 5 | 2 | 3 | 2 |
| Bond-improving agent | | | | | | | |
| Type | TPT | TPT | TOG | DBU | DBU | TPT | TPT |
| Amount (pbw) | 1 | 0.5 | 1 | 1 | 0.5 | 1 | 1 |
| Solvent | | | | | | | |
| Type | hexane/IPA | hexane/IPA | hexane/IPA | hexane/IPA | hexane/IPA | hexane/IPA | hexane/IPA |
| Amount (pbw) | 70/27 | 70/27 | 70/27 | 68/26 | 70/27.8 | 69/27 | 70/27 |

In Table 1, silane coupling agents A through G are as identified below.

A: $(CH_3O)SiC_3H_6NHC_2H_4NHCH_2CH=CH_2$
B: $(C_2H_5O)_3SiC_3H_6NH_2$
C: $(CH_3O)_3SiC_3H_6NHC_2H_4NH_2$
D: $(CH_3O)_3SiC_2H_4$—

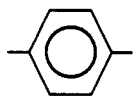

$CH_2NHC_2H_4NH_2$

E: a 1:1 (weight ratio) mixture of $(CH_3O)_3SiC_3H_6NH_2$ and

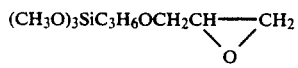

F: 

G: 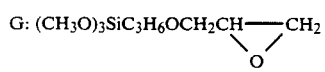

Also in Table 1, the bond-improving agents are titanates and nitrogen compounds as identified below.

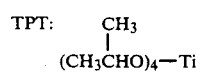
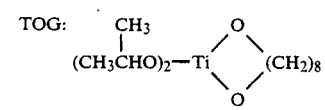

DBU: 1,8-diazabicyclo(7,5,0)undecene-7
IPA: isopropyl alcohol

Twelve resin-encapsulated semiconductor devices were fabricated as shown in Table 2. The devices were of the package type of 60-pin QFP: size 20 mm by 14 mm, resin thickness 0.7 mm under the die pad, and die pad size 10 mm by 8 mm. The devices were fabricated by assembling the elements in place, treating selected surfaces of the elements with primers I through VII, and molding the epoxy resin encapsulants shown in Table 2 over the elements. After molding, the devices were post cured at 180° C. for 4 hours and then allowed to stand in a constant temperature/constant humidity atmosphere of 85° C./85% RH for 72 hours. Thereafter, the devices were dipped in a solder bath at 260° C. for 30 seconds and observed whether cracks occurred in the packages. The results are reported in Table 2 under the heading "Cracked packages upon solder dipping" as the number of cracked packages per 10 packages.

Twelve resin-encapsulated semiconductor devices were fabricated using the same combinations as above except that the devices were of the package type of 14-pin DIP: size 20 mm by 14 mm, resin thickness 0.7 mm under the die pad, and die pad size 10 mm by 8 mm. For each of the combinations, 40 samples were fabricated. They were allowed to stand in a constant temperature/constant humidity atmosphere of 85° C./85% RH for 72 hours and thereafter, dipped in a solder bath at 260° C. for ten seconds. They were allowed to stand in a pressure cooker at 120° C. for 500 hours to observe corrosion of the aluminum electrodes at intervals. The results are also shown in Table 2 under the heading "Moisture barrier" as the number of rejected packages per 40 packages.

In Table 2, heading "Primer-Coated surface," die pad is the die pad rear surface, chip is the chip top surface, and lead frame is the insert portions of lead frames.

The epoxy resin encapsulants used in Examples 1 through 12 are shown in Table 3.

TABLE 2

| | Examples | | | | | | | | | | | |
|---|---|---|---|---|---|---|---|---|---|---|---|---|
| | 1 | 2 | 3 | 4 | 5 | 6 | 7 | 8 | 9 | 10* | 11* | 12* |
| Primer | | | | | | | | | | | | |
| Type | I | I | II | III | IV | V | VI | VII | VII | I | I | VII |
| Coated surface | die pad | die pad + chip | die pad | die pad | die pad + lead frame | die pad | die pad | die pad + chip | die pad | die pad | chip | die pad + chip |
| Epoxy resin encapsulant | E1 | E1 | E2 | E3 | E4 | E5 | E6 | E7 | E8 | E9 | E7 | E10 |
| Elongation (%) | 0.72 | 0.72 | 1.0 | 1.2 | 0.9 | 0.8 | 1.3 | 0.8 | 0.8 | 0.5 | 0.8 | 0.5 |

TABLE 2-continued

| | Examples | | | | | | | | | | | |
|---|---|---|---|---|---|---|---|---|---|---|---|---|
| | 1 | 2 | 3 | 4 | 5 | 6 | 7 | 8 | 9 | 10* | 11* | 12* |
| Moisture pickup (%) | 0.52 | 0.52 | 0.45 | 0.40 | 0.43 | 0.50 | 0.45 | 0.58 | 0.53 | 0.52 | 0.58 | 0.7 |
| Cracked packages upon solder dipping | 2/10 | 0/10 | 0/10 | 0/10 | 0/10 | 0/10 | 0/10 | 1/10 | 3/10 | 10/10 | 10/10 | 10/10 |
| Moisture barrier | | | | | | | | | | | | |
| after 50 hours | 0/40 | 0/40 | 0/40 | 0/40 | 0/40 | 0/40 | 0/40 | 0/40 | 0/40 | 0/40 | 0/40 | 0/40 |
| after 100 hours | 0/40 | 0/40 | 0/40 | 0/40 | 0/40 | 0/40 | 0/40 | 0/40 | 0/40 | 5/40 | 0/40 | 5/40 |
| after 150 hours | 0/40 | 0/40 | 0/40 | 0/40 | 0/40 | 0/40 | 0/40 | 0/40 | 0/40 | 35/40 | 0/40 | 25/40 |
| after 200 hours | 1/40 | 0/40 | 1/40 | 0/40 | 0/40 | 0/40 | 0/40 | 0/40 | 0/40 | 40/40 | 1/40 | 32/40 |
| after 500 hours | 3/40 | 0/40 | 1/40 | 0/40 | 0/40 | 2/40 | 0/40 | 0/40 | 1/40 | — | 5/40 | 40/40 |

*outside the scope of the invention

TABLE 3

| Epoxy Resin Encapsulant | E1 | E2 | E3 | E4 | E5 | E6 | E7 | E8 | E9 | E10 |
|---|---|---|---|---|---|---|---|---|---|---|
| Composition, parts by weight | | | | | | | | | | |
| Epoxy resin (I) | 80.5 | 59 | 42 | 59 | 42 | 27 | — | — | 56 | — |
| Epoxy resin (II) | — | — | — | — | — | — | 35 | 49 | — | 52 |
| Phenol novolak | 27 | 31 | 32 | 31 | 32 | 31 | 33 | 36 | 34 | 38 |
| Silicone modified phenol | 22 | — | — | — | — | — | — | — | — | — |
| Silicone modified epoxy (I) | — | — | — | — | 16 | — | 26 | — | — | — |
| Silicone modified epoxy (II) | — | — | 16 | — | — | 32 | — | — | — | — |
| Thermoplastic resin (I) | — | 5 | — | — | — | — | — | 5 | — | — |
| Thermoplastic resin (II) | — | — | — | 5 | — | — | — | — | — | — |
| Brominated epoxy resin | 10 | 5 | 10 | 5 | 10 | 10 | 6 | 5 | 10 | 10 |
| Fused silica | 280 | 280 | 280 | 280 | 280 | 280 | 350 | 350 | 280 | 280 |
| Antimony trioxide | 10 | 10 | 10 | 10 | 10 | 10 | 10 | 10 | 10 | 10 |
| Carbon black | 1.5 | 1.5 | 1.5 | 1.5 | 1.5 | 1.5 | 1.5 | 1.5 | 1.5 | 1.5 |
| Carnauba wax | 1.5 | 1.5 | 1.5 | 1.5 | 1.5 | 1.5 | 1.5 | 1.5 | 1.5 | 1.5 |
| Triphenylphosphine | 1.2 | 1.2 | 1.2 | 1.2 | 1.2 | 1.2 | 1.2 | 1.2 | 1.2 | 1.2 |
| γ-glycidoxypropyltrimethoxysilane | 1.5 | 1.5 | 1.5 | 1.5 | 1.5 | 1.5 | 1.5 | 1.5 | 1.5 | 1.5 |
| Properties | | | | | | | | | | |
| Elongation, % | 0.72 | 1.0 | 1.2 | 0.9 | 0.8 | 1.3 | 0.8 | 0.8 | 0.5 | 0.5 |
| Moisture pickup, % | 0.52 | 0.45 | 0.40 | 0.43 | 0.50 | 0.45 | 0.58 | 0.53 | 0.52 | 0.7 |

The components reported in Table 3 are identified below.

Epoxy resin (I): ortho-cresol novolak type epoxy resin (EOCN 1020, commercially available from Nihon Kayaku K.K.)

Epoxy resin (II): triphenolmethane type epoxy resin (EPPN 501, commercially available from Nihon Kayaku K.K.)

Brominated epoxy resin: BREN commercially available from Nihon Kayaku K.K.

Silicone modified phenol resin:

It is an addition reaction product of 60 parts by weight of an alkenyl radical-containing phenol novolak resin and 40 parts by weight of

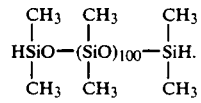

Silicone modified epoxy resin (I):

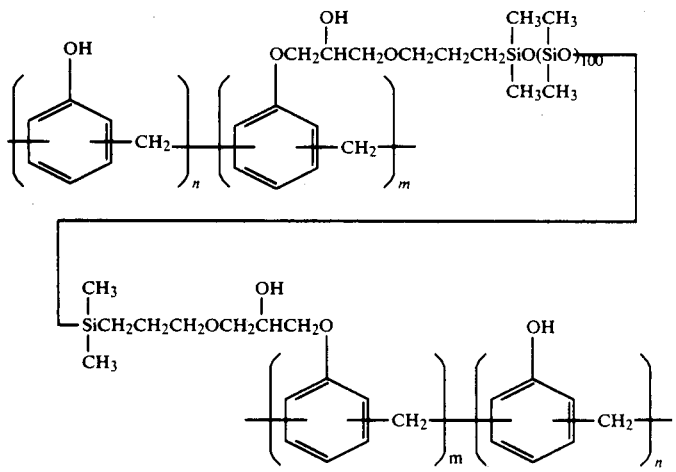

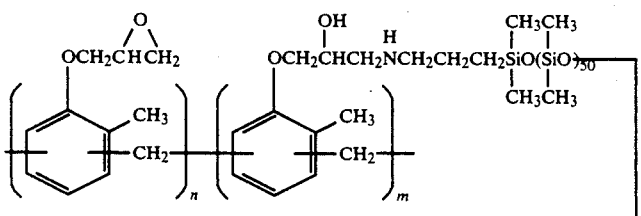

It is a reaction product of 60 parts by weight of an orthocresol novolak type epoxy resin and 40 parts by weight of

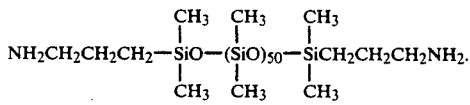

Silicone modified epoxy resin (II):

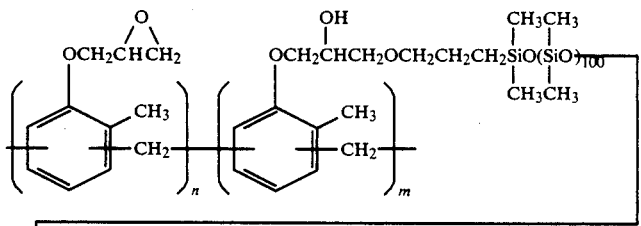

It is an addition reaction product of 65 parts by weight of an alkenyl radical-containing phenol novolak type epoxy resin and 35 parts by weight of

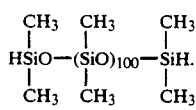

Thermoplastic resin (I): styrene-butadiene-methyl methacrylate (MBS) copolymer (KANEACE® B-56 manufactured by Kanegafuchi Kagaku K.K.)

Thermoplastic resin (II): styrene-ethylene-butene-styrene (SEBS) copolymer (TAFTEC® M1913 manufactured by Asahi Kasei K.K.)

Several preferred embodiments have been described. Obviously many modifications and variations of the present invention are possible in the light of the above teachings. It is therefore to be understood that within the scope of the appended claims, the invention may be practiced otherwise than as specifically described.

We claim:

1. A resin-encapsulated semiconductor device comprising a die pad, a silicon chip on the die pad, a lead frame electrically connected to the silicon chip, and an encapsulating resin molded over the elements, wherein at least the rear surface of the die pad remote from the silicon chip is treated with a primer comprising a silane coupling agent having the general formula

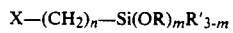

wherein X is an organic radical having up to 15 carbon atoms and having at least one member selected from the group consisting of epoxy, amino, carboxyl, hydroxyl, ureido, malemide, and trialkoxysilyl radicals, R is a monovalent hydrocarbon radical having 1 to 6 carbon atoms, R' is a monovalent hydrocarbon radical having 1 to 6 carbon atoms, n is an integer of from 1 to 10, and m is an integer of from 1 to 3, or a partial hydrolyzate thereof, and a bond-improving agent selected from the group consisting of organotitanates, primary, secondary and tertiary amines and cycloamidine derivatives in an amount of 0.001 to 100 parts by weight to 100 parts by weight of the silane coupling agent, and the encapsulating resin comprises an epoxy resin encapsulant having a tensile elongation of at least 0.7% at room temperature (25° C.) and a moisture pickup of up to 0.6% by weight after it is allowed to stand for 72 hours in an atmosphere at 85° C. and a relative humidity of 85%.

2. The device of claim 1 wherein at least part of the surfaces of the elements which are to be encapsulated with the resin is treated with the primer in addition to the rear surface of the die pad.

3. The device of claim 1 wherein the entire surfaces of the elements which are to be encapsulated with the resin are treated with the primer.

4. The device of claim 1 wherein the epoxy resin encapsulant is an epoxy resin composition in cured form comprising (A) an epoxy resin having at least two epoxy radicals per molecule, (B) a phenol novolak resin, (C) a tensile elongation modifier selected from the group consisting of a thermoplastic resin, silicone powder, a silicone modified phenol resin, and a silicone modified epoxy resin, and mixtures thereof, (D) an inorganic filler, and (E) a curing promoter.

5. The device of claim 1 wherein said bond-improving agent is at least one selected from the group consisting of titanium tetrabutoxide, titanium tetraisopropoxide, titanium tetra-nbutoxide, TOG and 1,8-diazabicyclo(7,5,0)undecene-7.

6. The device of claim 1 wherein said bond-improving agent is present in an amount of 0.1 to 80 parts by weight to 100 parts by weight of the silane coupling agent.

7. The device of claim 1 wherein at least the rear surface of the die pad remote from the silicon chip is treated with said primer such that the primer has a coating of up to 10 μm.

8. The device of claim 1 wherein at least the rear surface of the die pad remote from the silicon chip is treated with said primer such that the primer has a coating of up to 5 μm.

9. The device of claim 4 wherein the phenol novolak resin (B) is blended with the epoxy resin (A) in such a proportion that the ratio a/b of the moles (a) of epoxy radical of epoxy resin (A) to the moles (b) of phenolic hydroxyl radical of the phenol novolak resin (B) is in the range of from 1/10 to 10/1.

10. The device of claim 4 wherein component (C) is blended in an amount of 1 to 100 parts by weight per 100 parts by weight of epoxy resin (A).

11. The device of claim 4 wherein the inorganic filler (D) is blended in an amount of 25 to 90% by weight of the resin composition.

12. The device of claim 4 wherein the curing promoter (E) is blended in an amount of 0.1 to 5 parts by weight per 100 parts by weight of the total components (A) and (B).

* * * * *